United States Patent [19]

Levinson et al.

[11] Patent Number: 4,755,053
[45] Date of Patent: Jul. 5, 1988

[54] SECONDARY ALIGNMENT FIDUCIALS FOR AUTOMATIC ALIGNMENT USING MACHINE VISION.

[75] Inventors: Mitchell E. Levinson, San Diego; Thomas T. Frankie, Del Mar, both of Calif.

[73] Assignee: Hewlett-Packard Company, Palo Alto, Calif.

[21] Appl. No.: 931,302

[22] Filed: Nov. 12, 1986

[51] Int. Cl.$^4$ .............................................. G01B 11/00
[52] U.S. Cl. .................................. 356/400; 356/399; 356/401
[58] Field of Search ....................... 356/399, 400, 401; 355/53

[56] References Cited

U.S. PATENT DOCUMENTS 3,744,914 7/1973 Gonda ............................ 356/401 X
4,326,805 4/1982 Feldman et al. .................... 356/399
4,367,046 1/1983 Lacombat .......................... 356/400

Primary Examiner—Eugene R. Laroche
Assistant Examiner—Nathan W. McCutcheon
Attorney, Agent, or Firm—William J. Bethurum

[57] ABSTRACT

Apparatus and method are provided for reducing processing time for aligning two parts by machine vision. The prior art approach of utilizing a substrate (b 14) with two spaced-apart targets (16a, 16b) and a top-plate (10) with two primary alignment openings (b 12a, 12b) spaced apart the same distance as the targets is improved by providing a set of fiducials (a pair of secondary openings (18a, 18b) or a pair of marks (18'a, 18'b) on the surface) in the top-plate. As a consequence of the novel approach, the vision system is not confused by the similar reflectivities of the target and the top-plate as the substrate and top-plate are brought into contact. Accordingly, alignment may be readily rechecked after assembly.

5 Claims, 2 Drawing Sheets

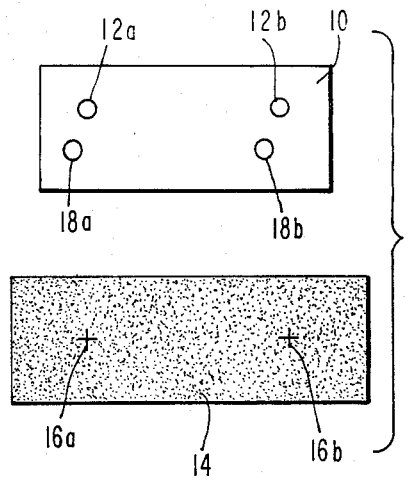
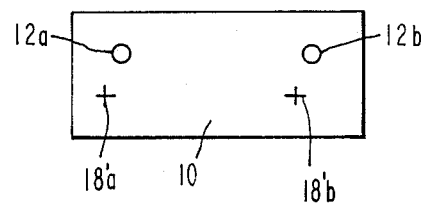
Fig. 3a.
Fig. 3b.
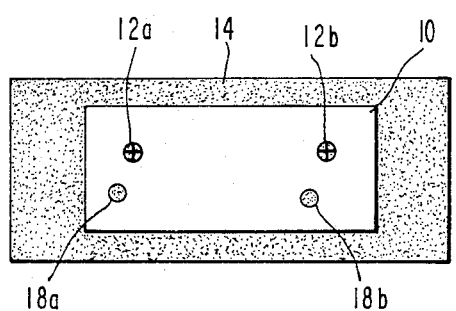
Fig. 5.
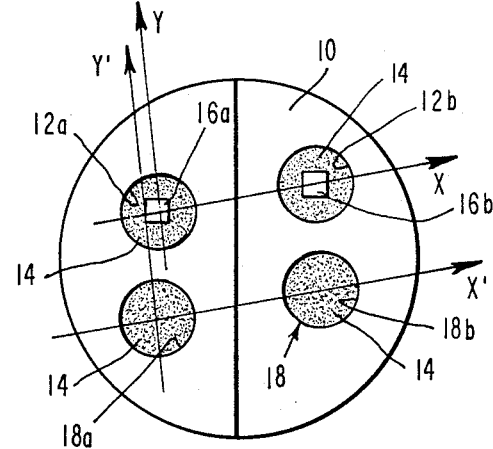
Fig. 4.

SECONDARY ALIGNMENT FIDUCIALS FOR AUTOMATIC ALIGNMENT USING MACHINE VISION.

TECHNICAL FIELD

The present invention relates to apparatus and method for aligning two parts that must be assembled together using machine vision.

BACKGROUND ART

In aligning two parts employing machine vision, it is common to provide two spaced-apart holes in one part (called the "top-plate") and two targets on the second part (called the "substrate"). The two targets are spaced apart the same distance as the two holes.

The vision system looks at the substrate and determines the X,Y positions of the targets. The top-plate is then moved into the field of view and the vision system determines the X,Y position of the holes. The substrate and top-plate are then brought into alignment with each other (one or the other part being mounted on an alignment stage). Next, the substrate and top-plate are brought into assembly contact with each other by transforming the coordinates and determining the X, Y and theta motions required for the openings and the targets to coincide.

It is desired to have the vision system re-check the alignment. The reflectivities of the top-plate and the substrate are discernably different, as are the reflectivities of the substrate and the target. However, the reflectivities of the top-plate and the target are often similar. Consequently, upon bringing the top-plate and substrate together, the reflectivity of the target is similar enough to that of the top-plate that the vision system cannot easily locate the alignment holes. Thus, re-checking alignment is difficult at best.

Accordingly, a need remains for apparatus and a method which permits facile alignment of two parts by machine vision and convenient re-checking thereof.

DISCLOSURE OF INVENTION

In accordance with the invention, a modified topplate is provided to aid in alignment of two parts. The top-plate is provided with a pair of fiducials having the same spacing as the two holes and offset therefrom by a determinable distance to a second position given by X',Y'. The fiducials may comprise a second pair of holes or a pair of marks on the surface of the top-plate.

A method of alignment is also provided. The method comprises initially aligning the targets on the substrate with the openings in the top-plate, as in the prior art. However, during the operation of bringing the two parts together, the vision system locates the pair of fiducials and focuses on the fiducials. Once the two parts are brought together, the vision system returns to the targets for re-checking of alignment and may perform any inspection required.

The amount of offset may be determined by the vision system each time prior to alignment. Alternatively, the amount of offset may be predetermined to speed up the accuracy of the procedure.

The apparatus and method of the invention provide a fast, low-cost way for assembling two parts in a desired alignment, using machine vision.

BRIEF DESCRIPTION OF THE DRAWINGS

FIG. 3a is a top plan view of a top-plate modified in accordance with the invention, depicting two alignment holes and two fiducials on the top plate and two targets on the substrate;

FIG. 3b is a top plan view similar to that of FIG. 3a, but showing an alternate embodiment of the two fiducials;

FIG. 4 is a top plan view, through split-field image, showing the top-plate in alignment with the targets and the fiducials in relation to the alignment holes; and FIG. 5 is a top plan view of an example of an assembled top-plate and substrate.

BEST MODES FOR CARRYING OUT THE INVENTION

Figure 1:
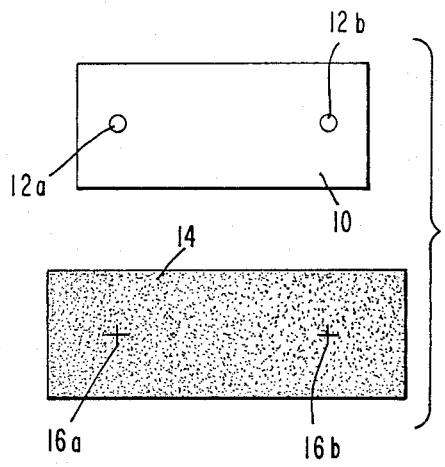
FIG. 1 is a top plan view of a top-plate and a substrate, showing two holes used for alignment purposes on the top plate and two targets on the substrate, employed in the prior art.

Referring now to the drawings wherein like numerals of reference designate like elements throughout, a top-plate 10 is provided with two holes or openings 12a, 12b. A substrate 14 is provided with two targets 16a, 16b. It is desired to line up the openings 12a, 12b with the targets 16a, 16b, and then assemble the top-plate 10 and the substrate 14.

The following alignment method can pertain to any two parts that must be aligned one to the other automatically, using machine vision. The primary alignment holes 12a, 12b are located in two places on the top-plate 10, spaced apart by a distance. Alignment targets 16a, 16b are located on the substrate 14, spaced the same distance apart as the alignment holes 12a, 12b.

The substrate 14 is placed such that the targets are in the field of view of a microscope, a camera, or other optical device. A common method for obtaining a "close-up" of both targets is by using a split-field image. While such an image is not essential to the practice of the invention, its use is conducive to facilitating alignment, as is well-known in the art.

Figure 2A:
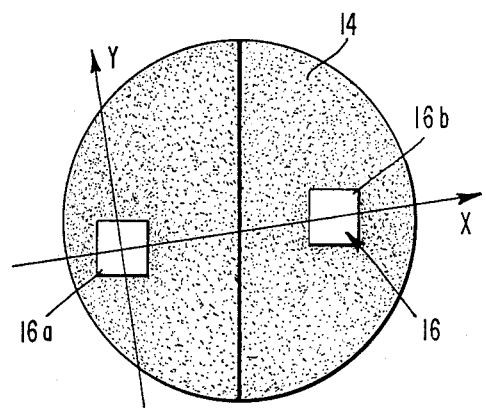
FIG. 2a is a top plan view, through split-field image, showing the targets on the substrate, employing the alignment method of the prior art.

The vision system may comprise any of the well-known machine vision systems; many such vision systems are commercially available and form no part of this invention. The vision system, which is employed in conjunction with the optical device, determines the locations of the centroids of the targets and establishes a pair of coordinate axes X,Y, as shown in FIG. 2a. For a target 16a, 16b comprising a circle, square, cross or other figure, the centroid, or center, of the target is easily determined.

Figure 2B:
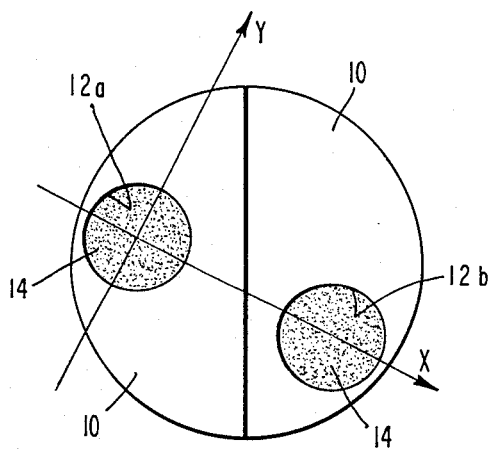
FIG. 2b is a top plan view, through split-field image, showing the top-plate with alignment holes, employing the alignment method of the prior art.

The top-plate 10 is moved into position above the substrate such that the alignment holes are in the field of view of the optical device. The parts 10, 14 are positioned so that the alignment targets 16a, 16b are defocused, and the vision system locates the alignment hole centroids and establishes a second pair of coordinate axes X,Y, as shown in FIG. 2b.

Figure 2C:
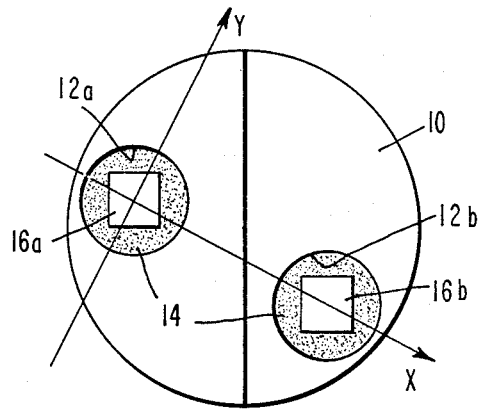
FIG. 2c is a top plan view, through split-field image, showing the top-plate in alignment with the targets.

The vision system performs a transformation of coordinates, and computes the X, Y and theta motions required for the centroids of both the alignment holes 12a, 12b and targets 16a, 16b to coincide. The vision system then sends commands to the tri-axis stage on which the top-plate 10 or substrate 14 rests, the stage moves, and the alignment is complete. The parts 10, 14 are then brought into contact, as shown in FIG. 2c. The parts may be brought into assembled contact, such as by adhesive, clamp, or other well-known process, or into temporary contact, such as done during certain masking steps in semiconductor processing.

In order to provide a check for the alignment using the targets 16a, 16b and the primary alignment holes 12a, 12b, the vision system would have to find the centroid of the alignment hole while the target is located and focused inside. If the reflectivity of the top-plate 10 and target 16 is too similar to be able to reliably distinguish one from the other, as is often the case, the vision system could become confused, and the centroids of the alignment holes would be difficult to find.

In accordance with the invention, a pair of fiducials 18 are provided on the top-plate. The pair of fiducials may comprise a pair of secondary alignment holes 18a, 18b, as shown in FIG. 3a. Since there is no target behind the secondary alignment holes 18a, 18b, the vision system can find the centroids of the secondary alignment holes without risk of confusion with any other figures. The centroid of the substrate targets 16a, 16b can still be found by choosing any point within the target, since the vision system "knows" accurately enough the location of the target, and thus it can reliably find one point that is somewhere on the target.

The vision system then defines the target 16a, 16b as all that material with similar relectivity connected continuously to the first point. There are several other vision algorithms that would enable the vision system to find the centroid of the target. Such algorithms are well-known and do not form a part of this invention; see, e.g., *Robot Vision*, edited by Alan Push, ISF Publications Ltd., United Kingdom (1983).

The vision system can be used to locate the secondary alignment holes 18a, 18b at the beginning of the alignment procedure. On the other hand, accurately knowing the positions of the secondary alignment holes 18a, 18b with respect to the primary alignment holes 12a, 12b (the amount of offset) would speed up the procedure by eliminating the vision system task.

In any event, knowing the location of the secondary alignment holes 18a, 18b on coordinate axes X',Y' implies knowing the location of the primary alignment holes 12a, 12b on coordinate axes X,Y, as depicted in FIG. 4. Thus, the alignment of the substrate targets 16a, 16b and the primary alignment holes 12a, 12b can be measured, and if necessary, an iterative correction can be performed, or the bad parts detected.

The foregoing discussion has been presented in terms of use of secondary alignment holes 18a, 18b, as shown in FIG. 3a. However, alternate fiducials 18 may be employed, such as crosses, dots or other marks, formed in the surface of the top-plate 10. An example of such alternate fiducials 18'a, 18'b is shown in FIG. 3b. In any event, the primary alignment holes 12a, 12b are either actual openings or, if covered, employ an optically clear material.

The fiducials 18 are offset from the primary alignment holes 12a, 12b by an amount at least sufficient to distinguish the fiducials from the primary alignment holes. The maximum amount of offset is limited by the size of the field of view, since it is desired to be able to view both the primary alignment holes and the fiducials in the same field of view.

The assembled top-plate 10 and substrate 12 is depicted in FIG. 5 as an example of one configuration. The apparatus and method of the invention have been used to assemble pens used in ink-jet plotters.

The apparatus and method of the invention permit saving vision system processing time for rapid re-checking of alignment after assembly. Without the fiducials 18 in the top-plate 10, it would be very difficult and time consuming to find the location of the top-plate relative to the substrate 14 after alignment is complete using the vision system. Thus, it would be very difficult to re-check alignment.

The two parts 10 and 14 are assembled after alignment (or re-checking thereof). Such assembly may comprise fastening in some fashion, such as by clamps or an adhesive (glue, epoxy, etc.) or the like. Current practice uses a UV curable adhesive. Thus, alignment can be made before UV exposure.

Alternatively, such assembly may avoid a permanent fastening, rather employing a temporary fastening, such as maintaining the top-plate and substrate in alignment for a period of time. An example of such temporary fastening is that employed in mask alignment used in semiconductor processing.

The secondary alignment holes 18a, 18b may be used instead of the primary alignment holes 12a, 12b in the initial alignment. This would eliminate the need to defocus the substrate target 16 during alignment hole 12 location, since there would be no confusing target behind the hole. This would in effect make the secondary alignment hole 18 the only alignment hole; the primary alignment hole 12 would be merely a window to see the target 16 for subsequent alignment "checks".

INDUSTRIAL APPLICABILITY

The apparatus and method of the invention are useful in any assembling operation of two piece parts where machine vision is employed to align and assemble the parts.

Apparatus and method for aligning and assembling two parts, comprising a top-plate having alignment holes and a substrate having targets, have been disclosed. The top-plate is provided with fiducials (openings or marks), in accordance with the invention. It will be appreciated by those of ordinary skill in the art that many changes and modifications of an obvious nature can be made without departing from the spirit and scope of the invention, and all such changes and modifications are considered to fall within the scope of the invention as defined by the appended claims.

What is claimed is:

1. A method of assembling two parts by machine vision, said parts comprising a substrate having a pair of spaced-apart target indicia on the surface thereof and a top-plate having (a) a pair of primary alignment openings therethrough spaced apart by the same distance as said targets and (b) a pair of secondary fiducials thereon, offset from said pair of primary alignment openings by a determinable value, said method comprising:

placing one of said substrate and said top-plate such that said targets or said primary alignment openings, respectively, are in the field of view of a machine vision system;
   determining the locations of the centroids of said targets or said primary alignment openings and establishing a first pair of X,Y coordinate axes therefor;

moving the other of said substrate and said top-plate into position, with said top-plate above said substrate such that the other of said targets or said primary alignment openings are in the field of view of said vision system;

determining the locations of the centroids of the other of said targets or said primary alignment openings and establishing a second pair of X,Y coordinate axes therefor;

transforming said coordinates and determining the X,Y and theta motions required for the centroids of both said primary alignment openings and said targets to substantially coincide;

aligning said top-plate and said substrate;

determining the locations of the centroids of said secondary fiducials;

using the amount of offset to re-determine the locations of said primary alignment openings; and re-checking the alignment of said top-plate and said substrate.

2. The method of claim 1 wherein said top-plate and said substrate are placed in permanent juxtaposition following said rechecking of said alignment.

3. The method of claim 1 wherein said top-plate and said substrate are placed in temporary juxtaposition following said rechecking of said alignment.

4. The method of claim 1 wherein said substrate is placed such that said targets are in the field of view of said vision system, the locations of said centroids of said targets are determined and said first pair of X,Y coordinate axes therefor are determined, said top-plate is moved into position above said substrate such that said pair of primary alignment openings are in the field of view of said vision system, and the locations of the centroids of said primary alignment openings are determined and said second pair of coordinate axes therefor are determined.

5. The method of claim 1 wherein said top-plate is placed such that said primary alignment openings are in the field of view of said vision system, the locations of said centroids of said primary alignment openings are determined and said first pair of X,Y coordinate axes therefor are determined, said substrate is moved into position below said top-plate such that said pair of targets are in the field of view of said vision system, and the locations of teh centroids of said targets are determined and said second pair of coordinate axes therefor are determined.

* * * * *